US007060134B2

(12) United States Patent
Chang

(10) Patent No.: US 7,060,134 B2
(45) Date of Patent: Jun. 13, 2006

(54) ONE PIECE SHIM

(75) Inventor: Kenny H. Chang, Union, KY (US)

(73) Assignee: Messier-Bugatti, Velizy-Villacoublay (FR)

(*) Notice: Subject to any disclaimer, the term of this patent is extended or adjusted under 35 U.S.C. 154(b) by 161 days.

(21) Appl. No.: 10/791,349

(22) Filed: Mar. 2, 2004

(65) Prior Publication Data

US 2004/0175564 A1 Sep. 9, 2004

Related U.S. Application Data

(60) Provisional application No. 60/450,678, filed on Mar. 3, 2003.

(51) Int. Cl.
*C23C 16/26* (2006.01)

(52) U.S. Cl. .................... 118/728; 427/249.2; 428/66.6

(58) Field of Classification Search ............. 427/249.2; 118/732, 728; 428/66.2, 66.6
See application file for complete search history.

(56) References Cited

U.S. PATENT DOCUMENTS

| | | | |
|---|---|---|---|
| 4,154,322 A | 5/1979 | Yamamoto et al. | 188/73.5 |
| 5,348,774 A | 9/1994 | Golecki et al. | |
| 5,904,957 A | 5/1999 | Christin et al. | |
| 6,109,209 A | 8/2000 | Rudolph et al. | |
| 6,284,969 B1 | 9/2001 | Fraas et al. | 136/253 |

FOREIGN PATENT DOCUMENTS

| | | |
|---|---|---|
| EP | 0 832 863 A2 | 4/1998 |
| EP | 0 792 384 B1 | 10/1998 |
| EP | 1 158 568 A2 | 11/2001 |
| FR | 2 754 813 A | 4/1998 |
| GB | 419 949 | 11/1934 |
| GB | 1 311 537 | 3/1973 |
| WO | WO 95/11869 | 5/1995 |

*Primary Examiner*—Alexander S. Thomas
(74) *Attorney, Agent, or Firm*—Weingarten, Schurgin, Gagnebin & Lebovici LLP

(57) ABSTRACT

A one-piece or otherwise unitary annular shim member made from a carbon material or a metallic is used to maintain a space between stacked annular preforms during a manufacturing process, such as densification. The one-piece structure advantageously simplifies the arrangement of the preforms in a process chamber and causes less deformation in the preforms. The carbon composition also provides beneficial thermal effects that improve the densification process. A debonding coating is provided on the carbon annular shim member in order to facilitate separation of the annular preforms from the shim members. The metallic annular shim member does not require a debonding coating.

22 Claims, 6 Drawing Sheets

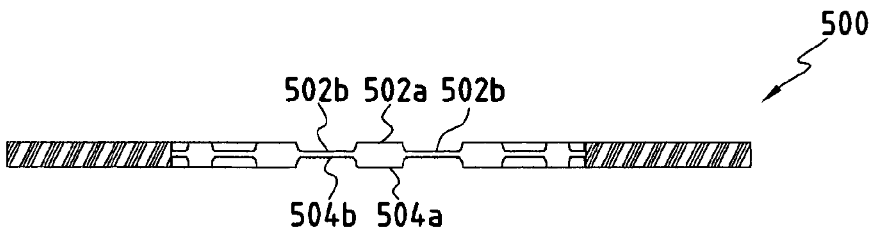
FIG.5C
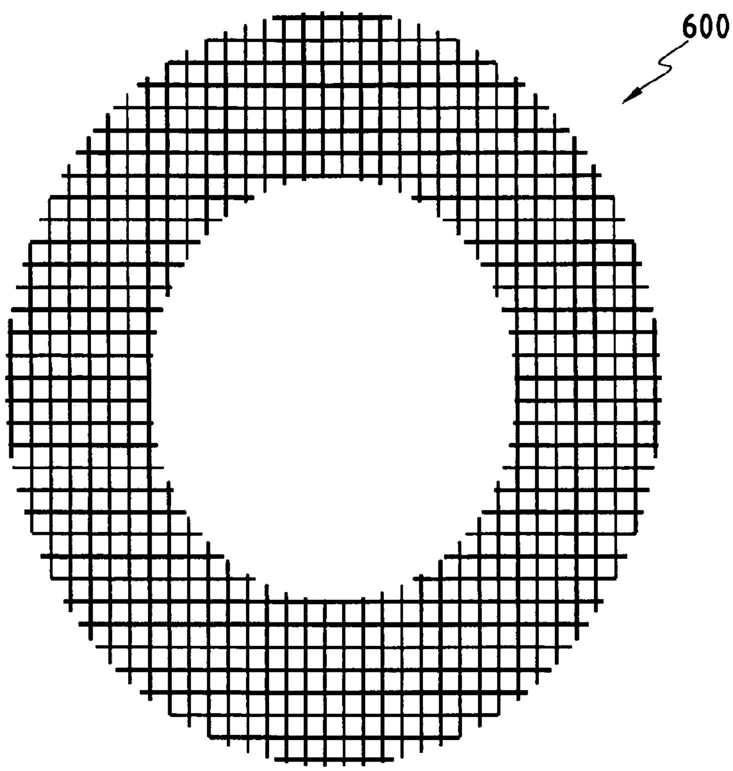
FIG.6A
FIG.6B
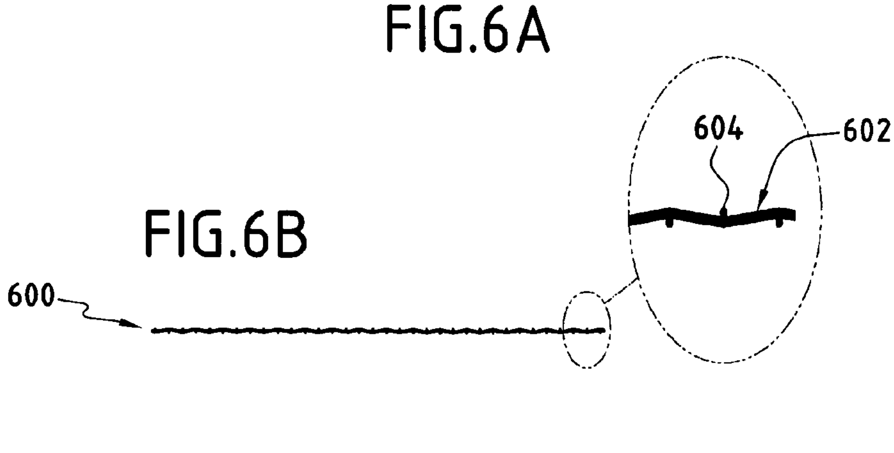

ONE PIECE SHIM

This application claims priority to U.S. provisional patent application No. 60/450,678 filed Mar. 3, 2003.

BACKGROUND OF THE INVENTION

The present invention relates to shim members used to space apart stacked porous substrates during a manufacturing process. A particular example of the present invention relates to metallic or carbon annular shim members used to space apart stacked annular composite material preforms especially during a densification process, such as chemical vapor infiltration (CVI).

The composite material preforms may particularly be annular preforms for making brake disks or other friction members.

An apparatus for densifying annular preforms to make brake disks and the like is disclosed in, for example, U.S. patent application Ser. No. 10/468,031 filed on Aug. 14, 2003; a representation thereof is illustrated in FIG. 1.

FIG. 1 is a highly diagrammatic illustration of a process chamber having an enclosure 10 therein containing a load of annular preforms or substrates 20 made from carbon fiber. The load is in the form of a stack of substrates having their respective central passages generally in vertical alignment. The stack may be made up of a plurality of superposed stack sections separated by one or more intermediate support plates 12.

The stacked substrates are separated from one another by means of spacers 30. As shown in FIG. 2, the spacers 30 may be disposed radially, and the number of them may vary. They provide gaps 22 of substantially constant height throughout the entire stack between adjacent substrates, while allowing the inside volume 24 of the stack, as constituted by the generally aligned central passages of the substrates, to communicate with the outer volume 26 situated outside the stack and inside the enclosure 10.

In the example of FIG. 1, the enclosure 10 contains a single stack of substrates. In a variant, a plurality of stacks of substrates may be disposed side by side in the same enclosure.

The enclosure 10 is heated by means of a susceptor 14, e.g. made of graphite, which serves to define the enclosure 10 and which is inductively coupled with an induction coil 16 situated outside a casing 17 surrounding the susceptor. Other methods of heating may be used, for example resistive heating (the Joule effect).

A gas containing one or more precursors of carbon, typically hydrocarbon gases such as methane and/or propane, is admitted into the enclosure 10. In the example shown, admission takes place through the bottom 10*a* of the enclosure. The gas passes through a preheater zone 18 formed by one or more pierced plates disposed one above another in the bottom portion of the enclosure, beneath the plate 11 supporting the stack of substrates. The gas heated by the preheater plates (which are raised to the temperature that exists inside the enclosure) flows freely into the enclosure, passing simultaneously into the inside volume 24, into the outer volume 26, and into the gaps 22. The residual gas is extracted from the enclosure by suction through an outlet formed in the cover 10*b*.

Spacers 30 are individually placed block members, most usually made from alumina. However, once formed, the alumina block members are very fragile, and losses from breakage are very high. In fact, in normal usage, the conventional alumina blocks frequently last not more than 2 or 3 densification cycles. This naturally raises manufacturing costs, as the alumina blocks must be replaced.

Moreover, the proper manual placement of individual alumina block members between each preform layer is extremely time-consuming. Six such block members are shown in FIG. 2 by way of illustrative example, and in actual practice as many as twelve blocks are used. The time burden is exacerbated by the extraordinary care needed to handle the fragile blocks without breakage. In general, a full densification process comprising seven trays of preforms (each with twelve to fourteen preform stacks) can take as long as one or two working days to set up according to the conventional method.

Another problem related to the use of individual spacer members 30 is that they tend to cause deformations (literally, dents) in the preforms caused by the weight of preforms (and spacers) stacked thereabove. As can be appreciated from FIG. 2, there are large unsupported areas of the preform circumferentially between the spacer members 30. Because the preform material is generally pliable, and because the alumina constituting spacer members 30 does not deform, indentations occur in the surface of the preforms in locations corresponding to the spacer members 30. These deformations, however slight, must be machined away in an extra finishing step so as to obtain a desirably planar surface usable for friction applications. As a result, the thickness of each preform is thicker than is needed for a final product, in anticipation of the deformations that occur in the known process and of the final machining step to remove those deformations. The machined-away material represents economic waste.

SUMMARY OF THE PRESENT INVENTION

In view of the foregoing, the present invention relates to a one-piece or otherwise unitary annular shim member for spacing apart stacked annular preforms.

A shim member according to the present invention has a generally flattened annular form with opposing first and second surfaces. At least one of the surfaces is shaped to include at least partially define radially extending gas flow paths for communicating the interior space of the shim member with an exterior.

A shim member according to the present invention is preferably similar in radial dimensions to the annular preforms adjacent thereto. That is, the shim member preferably has a similar interior diameter and a similar exterior diameter to the annular preforms. If the shim member is not generally identical in size to the annular preforms, it is preferable to slightly undersize the shim member (i.e., have an interior diameter greater than and/or an exterior diameter less than the annular preforms), rather than have the shim member be larger (i.e., radially wider) than the annular preforms.

In one example of the present invention, the shim member is made from a carbon material (such as graphite or carbon/carbon composite) having a debonding coating formed thereon. In another example of the present invention, the shim member is made from a metallic material having openings formed therethrough, including, without limitation, a metal mesh material. The metallic material may be bare (i.e., without a coating, including without a debonding coating), which makes manufacture and refurbishment correspondingly simpler and less expensive. In another example of the present invention, the shim member is made from a molded ceramic material.

BRIEF DESCRIPTION OF THE DRAWINGS

The present invention will be even better understood with reference to the figures attached hereto, in which:

FIGS. 5*a*–5*c* illustrate a third example of a one-piece shim member according to the present invention; and FIGS. 6*a* and 6*b* illustrate a fourth example of a one-piece shim member according to the present invention.

It is expressly emphasized that the figures herein are meant to merely illustrate examples of the present invention and are not to be construed as limiting the definition thereof in any way. It is also noted that the figures herein are not necessarily to scale, either in general or among interrelated views.

DETAILED DESCRIPTION OF THE PRESENT INVENTION

In general, a shim member according to the present invention has certain fundamentally useful characteristics.

A one-piece or otherwise unitary construction greatly facilitates the loading of a process chamber with stacked annular preforms, in comparison to the use of several individual spacer members between every annular preform in the stack. As noted above, the conventional arrangement described above with reference to FIG. 2 requires manual placement of each conventional spacer member. Moreover, because the conventional spacer member is usually made from a highly fragile material such as alumina, each spacer member must be handled with great care during an already lengthy and tedious manual process to try to avoid breakage. The spacer members are also relatively small and very thin (for example, 1"×4"×0.1"), which also makes handling them difficult.

With the use of a one-piece shim member according to the present invention, a single action of positioning the shim member replaces the several placement actions of positioning individual spacer members according to the conventional method. In comparison to the one to two days to load a process chamber in the conventional manner discussed above, the use of a one-piece shim according to the present invention could, on an equal basis, reduce loading times down to two to four hours.

Figure 2:
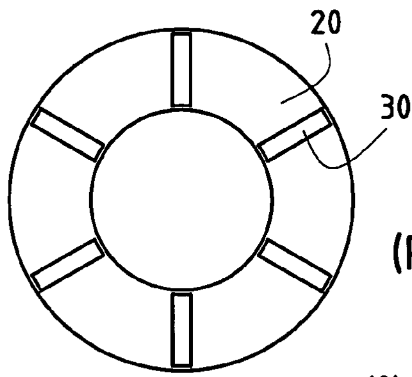
FIG. 2 illustrates an arrangement of individual spacer members for spacing apart the stacked annular preforms illustrated in FIG. 1.
Figure 1:
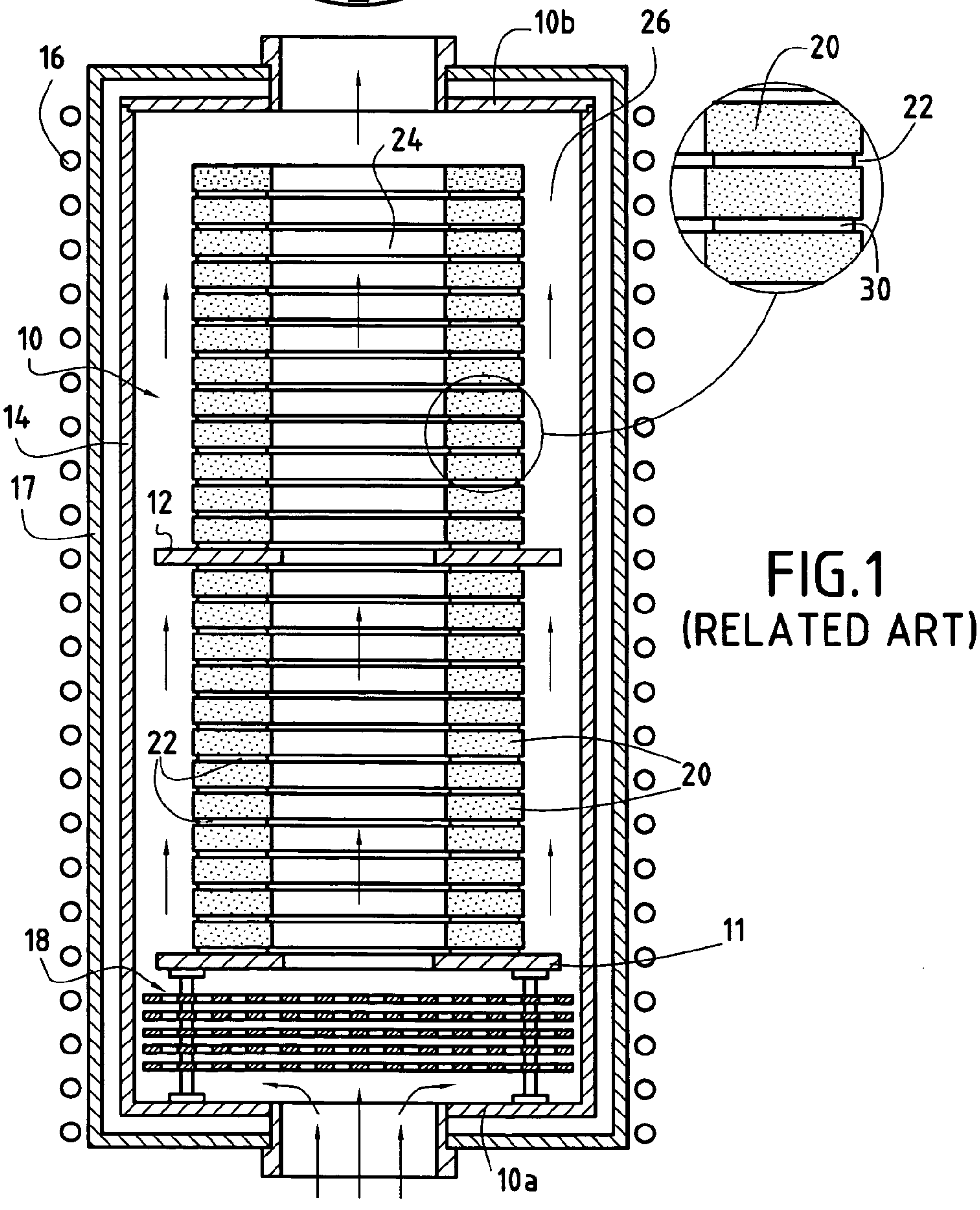
FIG. 1 illustrates a process chamber for densifying stacked annular preforms.

In addition, the structure of the one-piece shim member according to the present invention better supports the weight of the one or more annular preforms stacked thereon over a greater area, in comparison to the conventional use of individual spacer members, as illustrated in FIG. 2. In particular, the radial width of the annular one-piece shim member should be about equal to or slightly narrower than that of the annular preforms. As a result, each annular preform is less deformed after being removed from the process chamber. This means that less remedial machining is required after the densification process to obtain a usefully undeformed surface.

As just mentioned, the one-piece shim member preferably has about the same radial width as the annular preform, or is slightly narrower (for example, by about 5 mm with respect to the outside and/or inner diameters thereof). If the one-piece shim member were wider than the annular preform, the exposed portions would tend to have a residue build up (such as pyrolytic carbon) thereon from the decomposition of the densification gas. This would either reduce the useful life of the shim member or entail additional refurbishment procedures to remove such buildup. In addition, if the shim member extended radially outward beyond the outside edge of the annular preforms, it could cause a problem in positioning several annular preform stacks in a process chamber for simultaneous processing (as is frequently done). This would negatively affect production efficiency to the extent that fewer stacks could be processed together because of spacing issues within the process chamber.

In general, the one-piece shim member according to the present invention includes radially extending channels or other features on one or both surfaces thereof that, in net effect, at least partly define gas flow paths communicating the radially interior side of the one-piece shim member with the radially exterior side thereof. The mention of "partly" defined gas flow paths is made here because in some cases, the gas flow paths are also partly defined by the opposing surface of one of the annular preforms in cooperation with the structure of the one-piece shim member. The cross-sectional area of the gas flow paths using the one-piece shim is preferably comparable, in net effect, to the cross-sectional area presented in the prior art arrangement. However, this consideration may vary in accordance with individual situations.

It will be appreciated that the collective cross-sectional area of the gas flow paths presented can be affected, for example, by either adjusting the size of each channel or the like, or by providing more of the channels or the like. A deciding factor in this regard is maintaining a desirable level of support for the overlying annular preform(s).

Generally, the one-piece shim member according to the present invention should be made from a material that can withstand temperatures of up to about 1100° C., and preferably (for safety purposes) up to about 1200° C. to 1400° C. The chosen material is preferably minimally reactive with the preform at the operational temperatures mentioned.

Examples of materials appropriate for the one-piece shim member as contemplated include, without limitation, carbon materials such as graphite, carbon/carbon, and woven carbon fiber yarns; molded ceramics; and metallic materials such as stainless steel, Inconel alloy, titanium, molybdenum, tantalum, and tungsten.

FIGS. 3*a*–3*c*, 4*a*–4*c*, and 5*a*–5*c* illustrate example geometries of a carbon-based one-piece shim according to the present invention. The constitute material may be, for example, a carbon/carbon material or it may be a very thermally conductive graphite. In the latter case, suitable graphite is commercially available under names such as PGX, UCAR, and MKU-S.

A carbon/carbon material can be made into an annular shim according to the present invention in a known manner from a 2-D or 3-D preform (that may be needled) or laminated from multi-layers of woven carbon fiber fabric, and then densified using a CVI or resin impregnation process.

Carbon/carbon based starting materials can be molded and/or machined into shape in a known manner, and graphite used as a starting material can be machined in a known manner into a desired geometry from a blank.

Figure 3A:
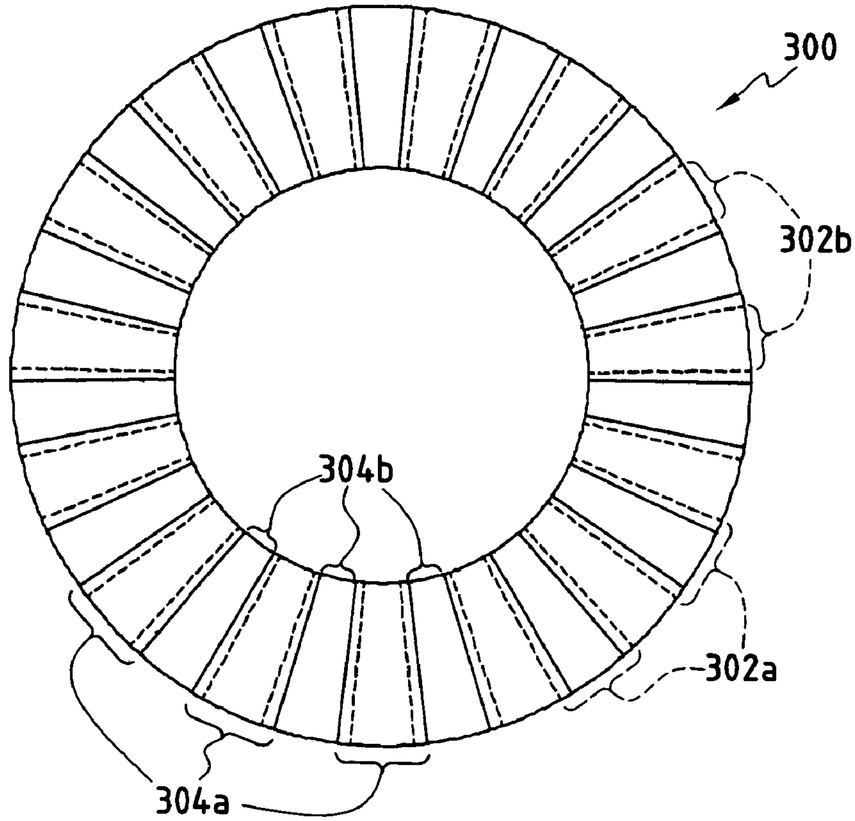
FIGS. 3*a*–3*c* illustrate a first example of a one-piece shim member according to the present invention.
Figure 3B:
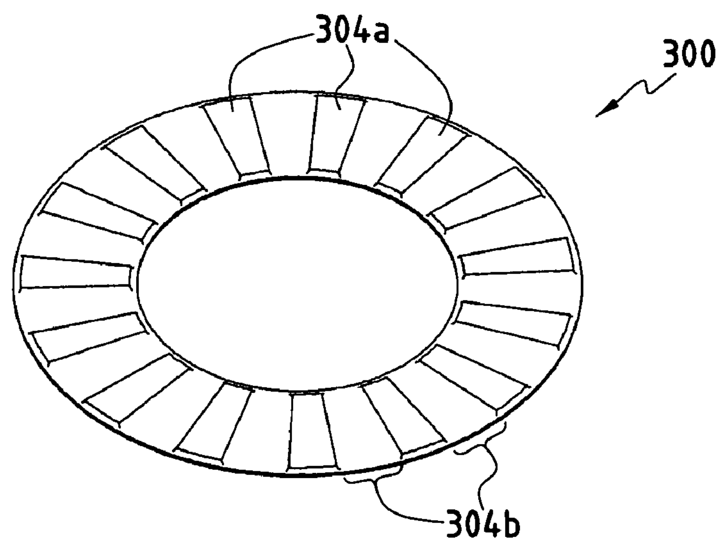
Figure 3C:
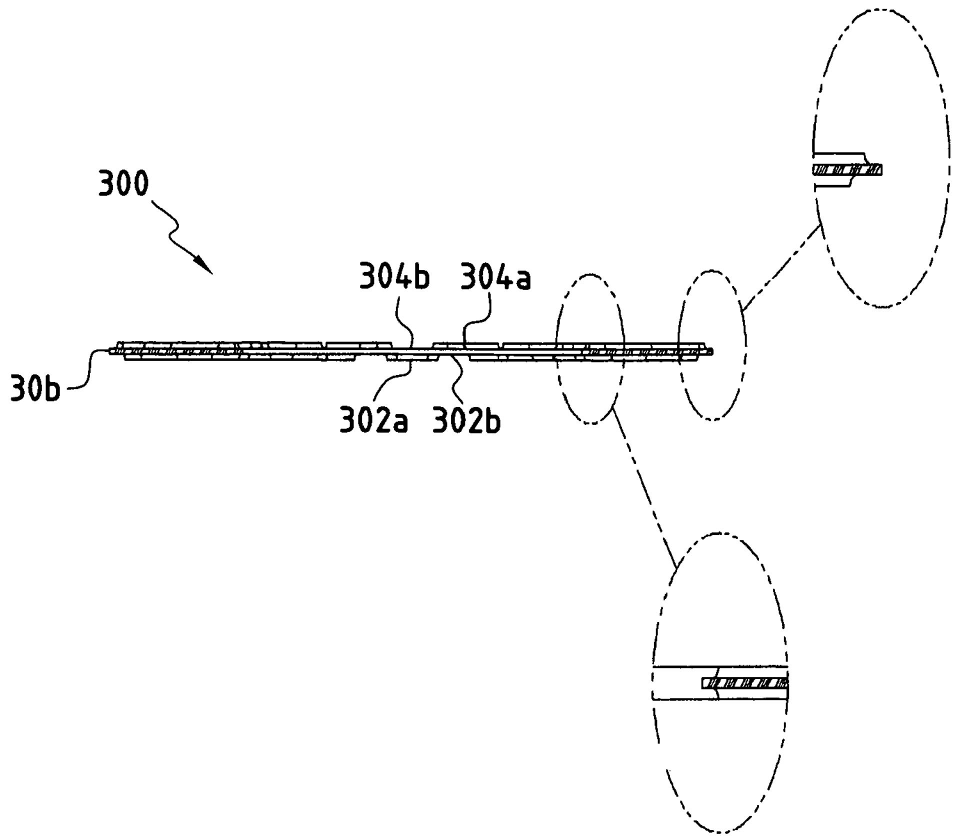

In FIGS. 3*a*–3*c*, FIG. 3*a* is a plan view of an annular shim member 300 according to the present invention. FIG. 3*b* is a perspective view of annular shim member 300. FIG. 3*c* is a cross-sectional elevational view of shim member 300 in a plane perpendicular to a plane in which the annular shim member 300 lies.

Annular shim member 300 has a plurality of spaced apart generally regularly shaped raised portions (some of which are indicated at 304*a*) alternating with relatively lowered portions therebetween (some of which are indicated at 304*b*) on one side thereof. Likewise, the other side of annular shim 300 has corresponding spaced apart generally regularly shaped raised portions (some of which are indicated by broken lines at 302*a*) alternating with relatively lowered portions therebetween (some of which are indicated at 302*b*).

In this example, edge portions of the raised portions 302*a*, 304*a* overlap an edge of a corresponding raised portion on the other side of annular shim member 300. See, for example, FIG. 3*c*. Collectively, they provide a greater weight bearing area than the conventional spacer members 30 mentioned above. Therefore, the weight of the stack is spread over a greater area, and the load is not concentrated in a way that causes the relatively severe impressions in the conventional method corresponding to the location of conventional spacer members 30.

Lowered portions 302*b*, 304*b* define radially extending channels or gas flow paths through which the densification gas can flow from an interior of the stacked annular preforms to the exterior. As mentioned above, the collective cross-sectional area that these channels present for densification gas flow may, in general, vary according to a specific processing situation. However, in general, the cross-sectional area should usually be comparable to that presented when using the conventional spacer members 30 mentioned above.

Figure 4C:
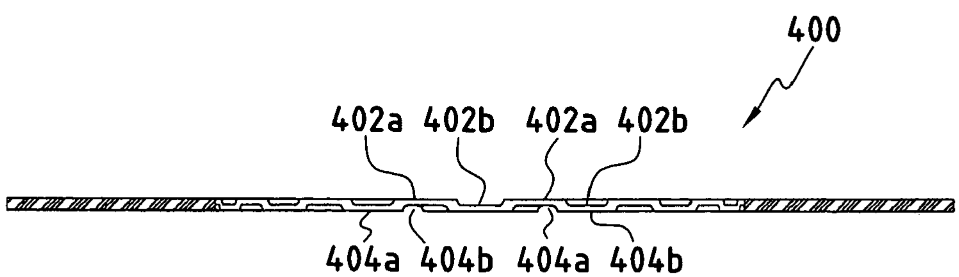
FIGS. 4*a*–4*c* illustrate a second example of a one-piece shim member according to the present invention.
Figure 4A:
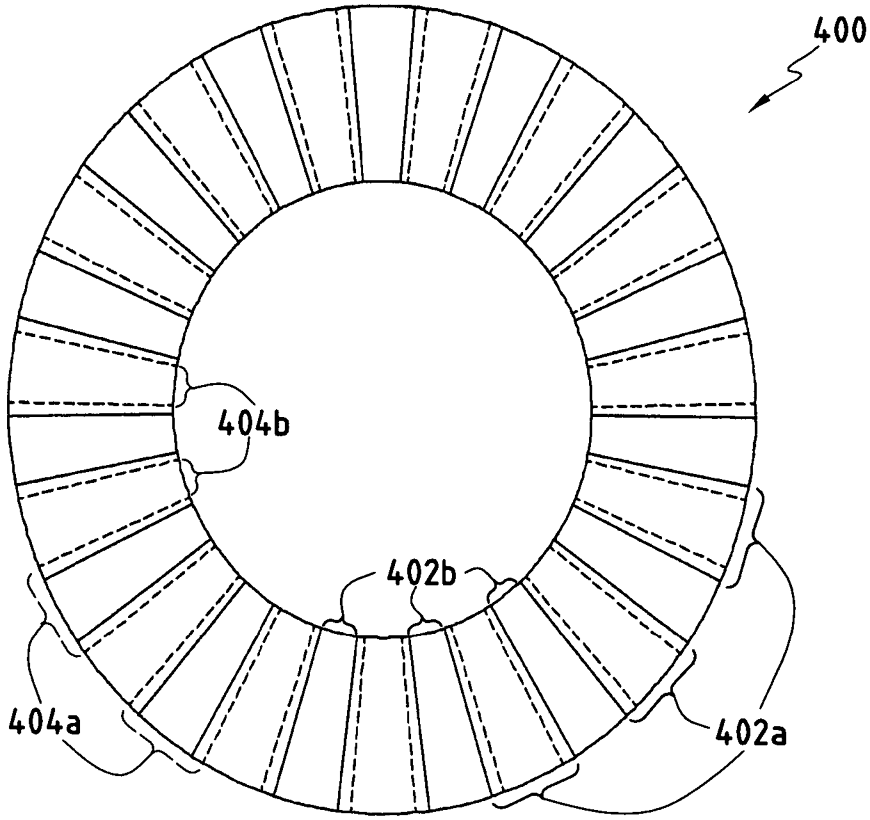
Figure 4B:
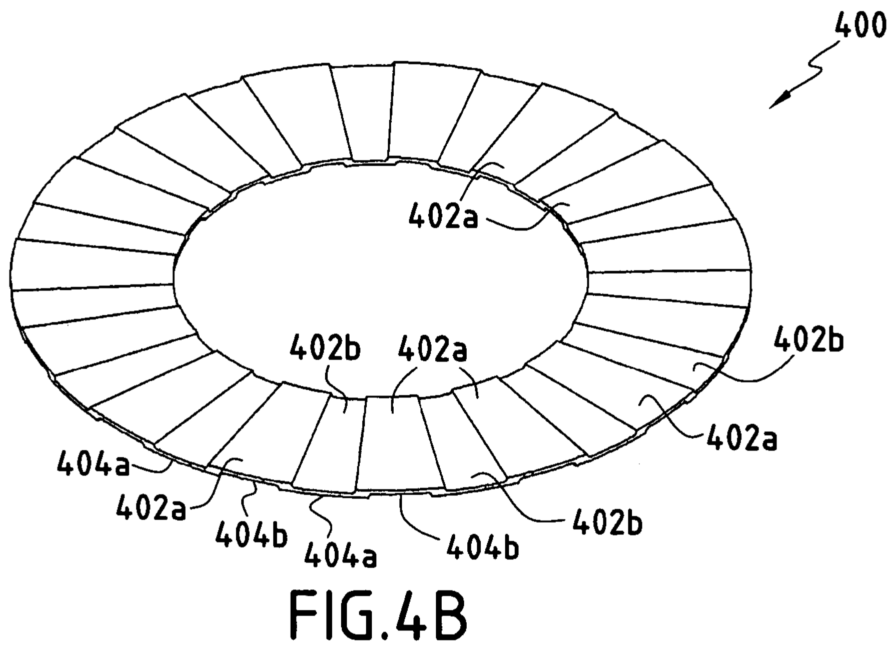

In FIGS. 4*a*–4*c*, FIG. 4*a* is a plan view of an annular shim member 400 according to the present invention. FIG. 4*b* is a perspective view of annular shim member 400. FIG. 4*c* is a cross-sectional elevational view of shim member 400 in a plane perpendicular to a plane in which the annular shim member 400 lies.

Annular shim member 400 has a structure similar to that of annular shim member 300, in that both sides thereof have relatively raised portions 402*a*, 404*a* alternating with relatively lowered portions 402*b*, 404*b*. Here, again, the relatively lowered portions 402*b*, 404*b* define radially extending channels or gas flow passages through which the densification gas can pass from an interior of the stacked annular preforms to an exterior thereof.

It can be seen in FIG. 3*c* that the structure of annular shim member 300 is defined relative to a central planar thickness of the constituent material 306. Thus, one can trace a straight circumferential path about an outside edge of annular shim member 300.

In contrast, because annular shim member 400 is relatively thinner than annular shim member 300, there is no equivalent planar thickness of the constituent material therein. Thus, it is only possible to trace an undulating path (corresponding to the alternating raised and lowered portions) along an outside edge of annular shim member 400. (See, for example, FIG. 4*c*.)

Figure 5A:
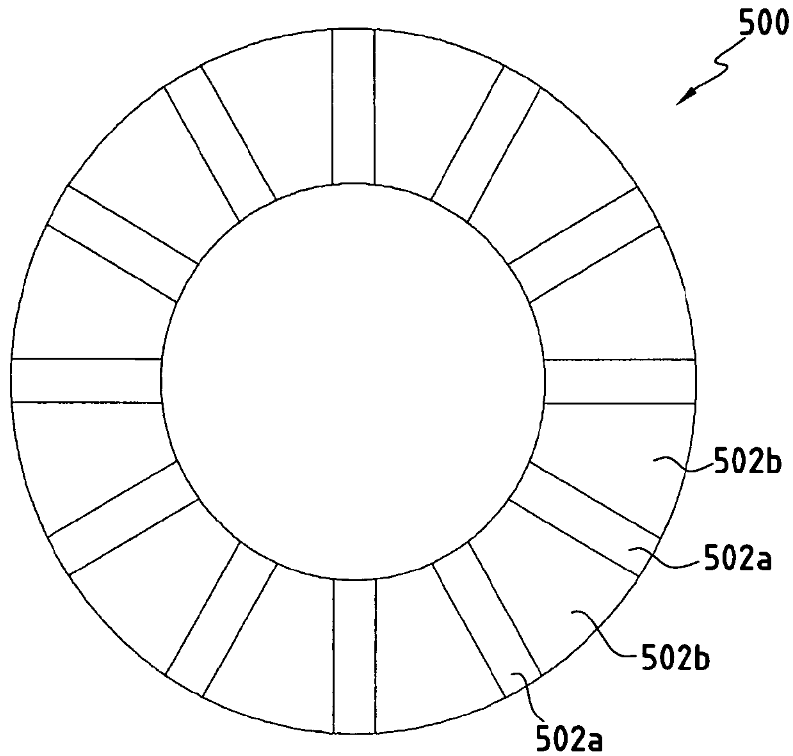
Figure 5B:
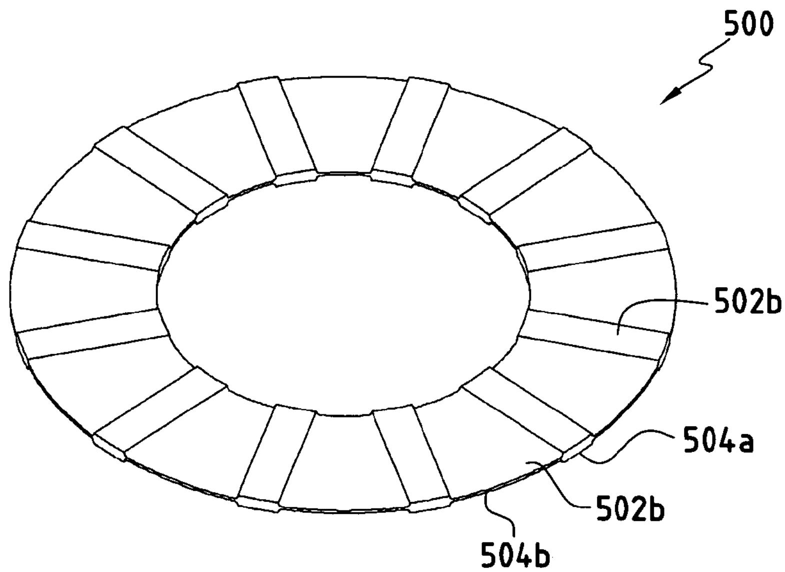

In FIGS. 5*a*–5*c*, FIG. 5*a* is a plan view of an annular shim member 500 according to the present invention. FIG. 5*b* is a perspective view of annular shim member 500. FIG. 5*c* is a cross-sectional elevational view of shim member 500 in a plane perpendicular to a plane in which the annular shim member 500 lies.

Most generally, annular shim member 500 differs from annular shim members 300 and 400 in that, relatively, the raised portions 502*a*, 504*a* on the opposite sides of annular shim member 500 are aligned, as are the lowered portions 502*b*, 504*b*. See, especially, FIG. 5*c*. As before, the lowered portions 502*b*, 504*b* at least partly define channels through which the densification gas can pass between an interior of the stacked annular preforms and an exterior thereof.

In one example, one can consider the manufacture of annular shim member 500 from the perspective of forming corresponding channels 502*b*, 504*b* on opposite faces of a carbon (e.g., graphite) blank having an initial thickness at least on the order of the thickness of the annular shim member 500 at locations where the raised portions 502*a*, 504*a* correspond.

As mentioned above, the aforementioned geometries can be obtained by any known and appropriate process, especially, but not only, machining or molding or both.

When using carbon materials to manufacture shim members according to the present invention for use with composite carbon annular preforms, there is sometimes a problem of the shim member adhering to the preforms after a densification process. In order to address this issue, the provision of a debonding coating on the surface of the shim member is contemplated in order to help avoid such adhesion.

One example of a useful debonding coating includes a first layer formed on the shim member made from $MoSi_2$, and a second layer formed on the first layer made from $Al_2O_3$. These layers can be formed using a known process of plasma spraying, for example. The $MoSi_2$ layer acts as a bridging layer to improve the adhesion of the $Al_2O_3$ layer to the structure.

It should be noted that the provision of a carbon-based shim member, especially a graphite shim member, has additional benefits during manufacture. In general, the provision of graphite shim members to the annular preform stack adds to the thermal mass of the stack so as to facilitate heating, and in turn, densification. This is beneficial because it is relatively difficult to raise the temperature of the preforms alone. (In a conventional process, the top and bottom of a stack of preforms have the highest level of densification because of their larger exposure to heating compared to intermediate preforms in the stack.) Also, because of the good thermal conductivity of the carbon shim members, a more uniform temperature distribution can be provided across the radial width of the adjacent annular preforms.

FIG. 6*a* is a plan view of another example of an annular shim member 600 according to the present invention, and FIG. 6*b* is a corresponding elevational view including a magnified partial portion thereof.

Annular shim member 600 is generally made from a perforated metallic material having an open area of about 20% to about 80%. In a particular example thereof, annular shim member 600 is made from a metallic mesh material.

The metallic material used to make annular shim member 600 must, as mentioned above, be able to withstand temperatures of up to about 1100° C., and preferably (to provide a safety factor) up to about 1200° C. to 1400° C. Stainless steel, Inconel alloy, titanium, molybdenum, tantalum, and tungsten are all appropriate examples of suitable metallic materials.

Annular shim member 600 may be formed by cutting an appropriately sized annular form from a sheet of stock material. Any appropriate industrial cutting method can be used, including, without limitation, computer-controlled laser cutting.

FIGS. 6*a* and 6*b* illustrate an example of the use of a mesh material to make annular shim member 600. As can be clearly seen in the magnified portion of FIG. 6*b*, the mesh material be a woven mesh manufactured according to known methods, especially including crimped weave methods. A crimped weave mesh refers to preshaping (i.e., crimping) the wires in at least one direction in the mesh. See, for example, the crimped wire 602 illustrated in FIG. 6*b*, relative to the wires 604. Thus, the undulations in wire 602 present, in effect, open spaces adjacent to transverse wires 604. These open spaces (which are interconnected over the area of annular shim member 600) collectively provide the passages through which the densification gas can pass between an interior of annular shim 600 and an exterior thereof.

In general, the thickness of the annular shim member 600 is about twice the diameter of a wire 602 or 604. In one example, the overall thickness of annular shim member 600 is between 1 mm and about 6 mm.

Annular shim member 600 has significantly different thermal expansion characteristics than the annular preforms so adhesions therebetween are negligible, and the debonding coating of the carbon annular shim can be omitted. Furthermore, the metallic mesh can be easily and simply reconditioned by, for example, sandblasting.

Some degree of metal contamination in the preforms is possible due to the temperatures at which densification takes place. However, it is believed that the depth of such contamination is negligible in view of the amount of material lost to surface machining and the like in the normal course of manufacture (for example, intermediate machining to reopen the porosity of the preforms so that densification can advance). As a result, what contamination there may be is usually removed anyway.

While the present invention has been described with respect to what are believed to be the most practical embodiments thereof, it is particularly noted that this is by way of example only, and appropriate modifications and variations thereof are possible within the spirit and scope of the claims appended hereto.

What is claimed is:

1. A method of preparing a plurality of annular carbon fiber preforms for a chemical vapor infiltration process, comprising:

stacking the plurality of annular carbon fiber preforms, wherein an annular unitary shim member made from a carbon material is provided between each respective pair of the annular carbon fiber preforms, the stacked plurality of annular carbon fiber preforms and annular unitary shim members collectively defining an interior space within the stack, wherein each annular unitary shim member has oppositely facing first and second surfaces and a plurality of radially extending channels formed on at least one of said first and second surfaces for communicating the interior space of the stack with an exterior of the stack, each annular unitary shim member being provided with a debonding coating formed thereon for preventing the annular carbon fiber preforms from adhering thereto.

2. The method according to claim 1, wherein each of the first and second surfaces of each annular unitary shim member has a respective plurality of channels formed thereon.

3. The method according to claim 2, wherein the plurality of channels formed on the first surface is substantially aligned with the plurality of channels formed on the second surface.

4. The method according to claim 2, wherein the plurality of channels formed on the first surface is offset in a circumferential direction from the plurality of channels formed on the second surface.

5. The method according to claim 1, wherein the carbon material is one of a carbon/carbon material and a solid graphite material.

6. The method according to claim 5, wherein the carbon/carbon material is one of a needled carbon preform and a woven carbon fabric laminate.

7. The method according to claim 1, wherein the debonding coating comprises a first layer of $MoSi_2$ formed on the carbon material, and a second layer of $Al_2O_3$ formed on the first layer of $MoSi_2$.

8. The method according to claim 1, wherein the provision of the annular unitary shim member made from a carbon material between each respective pair of the annular carbon fiber preforms increases the thermal mass of the stack so as to improve the efficiency of the chemical vapor infiltration process.

9. The method according to claim 1, wherein each annular shim has an outer diameter smaller than an outer diameter of the annular carbon fiber preforms and an inner diameter larger than an inner diameter of the annular carbon fiber preforms.

10. The method according to claim 9, wherein the outer and inner diameters of each annular shim are about 5 mm smaller than and about 5 mm greater than, respectively, the outer and inner diameters of the annular carbon fiber preforms.

11. A method of preparing a plurality of annular carbon fiber preforms for a chemical vapor infiltration process, comprising:

stacking the plurality of annular carbon fiber preforms, wherein an annular shim member made from a metallic material is provided between each respective pair of the annular carbon fiber preforms, the stacked plurality of annular carbon fiber preforms and annular shim members collectively defining an interior space within the stack, wherein each annular shim member has first and second opposing surfaces and at least partly defines a plurality of radially extending gas flow paths for communicating the interior space of the stack with an exterior of the stack.

12. The method according to claim 11, wherein the metallic material is a bare metallic material.

13. The method according to claim 11, wherein the metallic material is a wire mesh.

14. The method according to claim 13, wherein the metallic material is a refractory material.

15. The method according to claim 13, wherein the metallic member comprises one or more of stainless steel, inconel alloy, titanium, molybdenum, tantalum, and tungsten.

16. The method according to claim 13, wherein the wire mesh has an open mesh area of about 20% to about 80%.

17. The method according to claim 13, wherein the member has an effective thickness of about 1 mm to about 6 mm.

18. The method according to claim 13, wherein the wire mesh includes a crimped weave mesh.

19. The method according to claim 13, wherein the member has an effective thickness of about twice the diameter of the wire constituting the wire mesh.

20. The method according to claim 14, wherein the refractory material can withstand temperatures of up to about 1400° C.

21. The method according to claim 11, wherein each annular shim has an outer diameter smaller than an outer diameter of the annular carbon fiber preforms and an inner diameter larger than an inner diameter of the annular carbon fiber preforms.

22. The method according to claim 21, wherein the outer and inner diameters of each annular shim are about 5 mm smaller than and about 5 mm greater than, respectively, the outer and inner diameters of the annular carbon fiber preforms.

* * * * *